(12) United States Patent
Abbott

(10) Patent No.: US 6,579,120 B2
(45) Date of Patent: Jun. 17, 2003

(54) SLEEVE ASSEMBLY FOR AN ELECTRONIC CHIP

(75) Inventor: Ryan Abbott, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/843,884

(22) Filed: Apr. 30, 2001

(65) Prior Publication Data

US 2002/0160655 A1 Oct. 31, 2002

(51) Int. Cl.⁷ .................................................. H05K 1/00
(52) U.S. Cl. ........................................ 439/526; 439/607
(58) Field of Search ............................ 439/526, 68–73, 439/525, 330, 331, 107, 607; 206/719, 721, 724, 722; 174/52.4; 361/820

(56) References Cited

U.S. PATENT DOCUMENTS

| | | | | |
|---|---|---|---|---|
| 4,433,886 A | * | 2/1984 | Cassarly et al. | 439/65 |
| 4,506,938 A | * | 3/1985 | Madden | 439/71 |
| 5,241,453 A | * | 8/1993 | Bright et al. | 361/704 |
| 5,302,853 A | * | 4/1994 | Volz et al. | 257/707 |
| 5,435,750 A | * | 7/1995 | Kosmala | 439/567 |
| 5,735,698 A | * | 4/1998 | Bakker et al. | 439/91 |

* cited by examiner

Primary Examiner—P. Austin Bradley
Assistant Examiner—Ross Gushi

(57) ABSTRACT

A sleeve assembly for housing and protecting an electronic chip. The sleeve assembly includes a first sleeve member and a second sleeve member attached to the first sleeve member. The first sleeve member includes at least one substrate engaging member adapted to be inserted into an engaging member hole located on a substrate and at least one chip guiding member adapted to substantially correctly align an electronic chip with a socket when the electronic chip is inserted into the sleeve assembly. Additionally, the at least one engaging member and the at least one chip guiding member extend from a lower surface of the sleeve assembly. The sleeve assembly serves to protect the electronic chip from physical and electrostatic discharge damage during storage as well as after the electronic chip is mated with the socket.

16 Claims, 3 Drawing Sheets

SLEEVE ASSEMBLY FOR AN ELECTRONIC CHIP

FIELD OF THE INVENTION

This invention relates generally to a sleeve assembly for an electronic chip. More particularly, the invention relates to a sleeve assembly having a plurality of components for protecting an electronic chip from both physical and electrostatic discharge damage during storage and assisting with installation of the electronic chip.

BACKGROUND OF THE INVENTION

Electronic chips, e.g., devices fabricated for insertion into central processing units, video systems, audio systems, or the like, are widely used to perform processing operations in electronic devices. Through advances in technology, electronic chips have been manufactured in ever decreasing sizes while becoming capable of performing ever increasingly complex functions. To effectuate these functions, electronic chips are generally positioned in electrical contact with sockets, e.g., a ball grid array socket, disk socket, zero force insertion force socket, etc., positioned on substrates of the electronic devices. The electrical contacts are typically enabled by the insertion of a plurality of pins projecting from the electronic chips into a plurality of mating holes located in the sockets. In this respect, electronic chips generally possess a rather significant number of pins, e.g., on the order of about 700 pins.

In order to maintain the relatively small size of the electronic chips, while allowing for a relatively large number of pins to be situated on the electronic chips, the pins of known electronic chips are typically relatively thin and are thus susceptible to damage (i.e., the pins may be bent, broken off, or the like). This is an important factor to consider when storing the electronic chips as well as when inserting the pins of an electronic chip into the holes of a socket. For instance, when storing the electronic chips, it is often necessary to protect the pins from being bent or otherwise damaged.

Additionally, when inserting the pins into the socket holes, if the pins and the socket holes are not accurately aligned, some or all of the pins may become damaged as pressure is applied to insert the pins into the socket holes. Moreover, due to the nature of electronic chips, e.g., the rather large number of pins, a relatively significant risk of electrostatic discharge damage to the electronic chip is posed, both during storage and insertion of the chip into the socket.

It is currently relatively difficult to install known electronic chip pins into socket holes without damaging the pins. More specifically, it is often difficult for a user to see whether the pins of an electronic chip are correctly aligned with the socket holes and thus, the user may inadvertently misalign the pins with the holes thereby causing the pins to bend or otherwise become damaged as pressure is applied during insertion of the chip. Additionally, electronic chips are typically square and thus there is generally no feedback to demonstrate that the chip is correctly oriented with respect to the socket.

One solution to the problems associated with aligning the pins and the socket holes discussed above has been to provide a pair of posts on a socket to assist a user in conducting a visual check to align the electronic chip with the socket. In this type configuration, the posts may provide for vertical alignment of the pins and the socket holes, however, horizontal alignment is limited to being visually checked by a user. One drawback associated with this type of configuration is that visual alignment of the electronic chip with the socket has not proven to be sufficiently accurate to allow for the proper alignment and correct orientation cannot be determined. Instead, it has been found that even through use of this type of configuration, the pins of an electronic chip were still susceptible to damage both during installation of the electronic chip and during its storage.

SUMMARY OF THE INVENTION

According to the principles of the present invention, a sleeve assembly is provided to protect an electronic chip from physical damage as well as electrostatic discharge damage during both storage and installation of the electronic chip. In addition, with regard to the installation of the electronic chip into a socket, the sleeve assembly is configured to assist in the insertion of the electronic chip by utilizing a separate mechanical means to align and orient the electronic chip pins with the socket holes, thereby overcoming the drawbacks and disadvantages associated with known ways of aligning electronic chip pins with socket holes.

According to another aspect, the present invention pertains to a system for protecting and guiding an electronic chip into engagement with a socket. The system includes a sleeve assembly enclosing an electronic chip, in which, the sleeve assembly possesses a first sleeve member and a second sleeve member. The first sleeve member supports the electronic chip and the second sleeve member is configured to substantially reduce the electromagnetic interference of the electronic chip. The sleeve assembly is operable to assist in guiding the electronic chip into substantially proper engagement with a socket located on a substrate.

According to another aspect, the present invention pertains to a method for protecting and guiding an electronic chip on to a socket positioned on a substrate of an electronic system. According to the method, an electronic chip is inserted into a sleeve assembly possessing a first sleeve member and a second sleeve member. The sleeve assembly also possesses a plurality of substrate engaging members. In this respect the sleeve assembly functions to protect the electronic chip from physical damage.

BRIEF DESCRIPTION OF THE DRAWINGS

Features and advantages of the present invention will become apparent to those skilled in the art from the following description with reference to the drawings, in which.

DETAILED DESCRIPTION OF THE INVENTION

For simplicity and illustrative purposes, the principles of the present invention are described by referring mainly to an exemplary embodiment thereof, particularly with reference to an example of an electronic chip of an electronic system. However, one of ordinary skill in the art would readily recognize that the same principles are equally applicable to, and can be implemented in, any device that utilizes an electronic chip mounted on a socket of an electronic device, and that any such variation would be within such modifications that do not depart from the true spirit and scope of the present invention.

Figure 1:
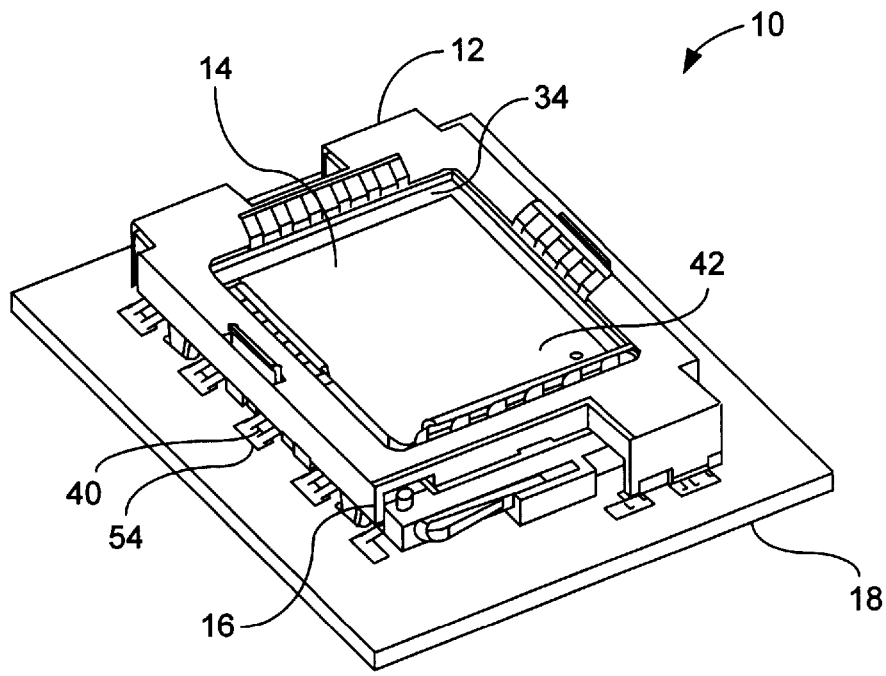
FIG. 1 shows a perspective view of a sleeve assembly having an electronic chip inserted therein and in which the sleeve assembly and the electronic chip are attached to a substrate of an electronic system.

Referring to the various illustrations in sequence, a sleeve assembly 12, an electronic chip 14, a socket 16, and a substrate 18 are illustrated in FIG. 1 by the reference numeral 10. As illustrated in FIG. 1, the sleeve assembly 12 includes a generally centralized opening 34 through which a top portion 42 of the electronic chip 14 may extend. One purpose of extending a top portion 42 of the electronic chip 14 through the sleeve assembly 12 is to allow for a thermal connection to be made between the electronic chip 14 and a heat dissipating device (e.g., heat sink, heat pipe, refrigeration system, etc.) in a manner known to those of ordinary skill in the art (not shown). Thus, the sleeve assembly 12 of the present invention does not significantly impede the cooling of the electronic chip 14.

Figure 2:
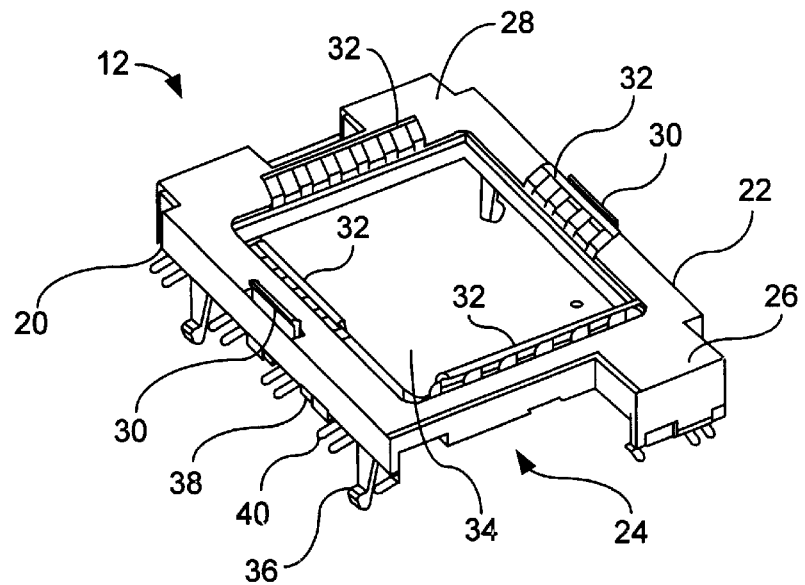
FIG. 2 is an exploded perspective view of a sleeve assembly, an electronic chip, and a socket attached to a substrate of an electronic system.

In reference to FIG. 2, there is shown an exploded perspective view of a sleeve assembly 12. As illustrated in FIG. 2, the sleeve assembly 12 is composed of a first sleeve member 20 generally housed within a second sleeve member 22. The first sleeve member 20 may generally be formed of a plastic material. More specifically, the first sleeve member 20 may be formed of a plastic material which may withstand heat generated by an electronic chip without substantially becoming deformed or otherwise damaged. Additionally, the first sleeve member 20 may be molded from a single piece of plastic material. For example, suitable materials for the first sleeve member 20 include polycarbonate, ABS, and the like. The second sleeve member 22 may generally be formed of a metallic material capable of conducting sufficient electricity to provide an adequate electromagnetic field around an electronic chip 14. Additionally, the metallic material of the second sleeve member 22 may be chosen to adequately conduct heat from an electronic chip to a heat dissipating device (e.g., stainless steel and the like). According to a preferred embodiment, the second sleeve member 22 may be formed from a single sheet of metal material and cut and bent into the shape shown in FIG. 2.

In further reference to FIG. 2, according to a preferred embodiment of the present invention, a cut out portion 24 is provided in the sleeve assembly 12 to provide clearance for an activation arm 46 of a socket 16. By virtue of the cut out portion 24, a first extension 26 is formed along a side wall of the sleeve assembly 12. A second extension 28 is provided on the sleeve assembly 12 on an opposite side of the first extension 26. As can be seen in FIG. 2, the first sleeve member 20 is relatively smaller than the second sleeve member 22. Although the sleeve assembly 12 is illustrated as including a cut out portion 24, it is to be appreciated that should the socket 16 not include an activation arm 46, the cut out portion 24 may be omitted to thereby substantially enclose all of the sides of the electronic chip 14. In this respect, the sleeve assembly 12 of the present invention may be modified in many respects to accommodate for variously configured electronic chips and substrates without departing from the scope and spirit of the present invention. In addition, an interior surface of the first sleeve member 20 may also be modified to include features to allow a clearance for components of the electronic chip 14 and socket 16, such that, the sleeve assembly 12 may be attached to a substrate 18 without substantial interference from either the electronic chip or the socket.

Upwardly protruding members 30 are provided along opposite sides of the sleeve assembly 12 and are provided to assist in the manipulation of the sleeve assembly 12. In this respect, the upwardly protruding members 30 provide a plurality of surfaces for supporting the sleeve assembly 12 during installation of an electronic chip 14 into the sleeve assembly and for manipulating the sleeve assembly along with the electronic chip onto a socket 16. According to a preferred embodiment of the present invention, the upwardly protruding members 30 may be formed integrally with the first sleeve member 20 and may extend through openings provided on the second sleeve member 22. However, the upwardly protruding members 30 may also be formed separately and attached to either of the first and second sleeve members 20, 22. In addition, although FIG. 2 depicts two upwardly protruding members 30 located on opposite sides of the sleeve assembly 12, it is within the purview of the present invention that a plurality of upwardly protruding members 30 may be located on each of the opposite sides of the sleeve assembly and that the upwardly protruding members may also be located the other two opposite sides.

In addition, a plurality of springs 32 are provided along an upper surface of the second sleeve member 22. As illustrated in FIG. 2, the springs 32 generally extend above an upper surface of the sleeve assembly 12 and are generally positioned around an opening 34 provided in the sleeve assembly 12. According to a preferred embodiment of the present invention, the springs 32 may be integrally formed with the second sleeve member 22 or the springs may be otherwise attached to the sleeve assembly 12. In either case, the springs 32 are configured to allow for electrical conduction between the heat dissipation device and the second sleeve member 22 to thereby create an electromagnetic interference shield around a top portion 42 of the electronic chip 14.

With further reference to FIG. 2, the first sleeve member 20 includes a plurality of substrate engaging members 36 and chip guiding members 38 extending from a lower surface of the first sleeve member. The substrate engaging members 36 extend to a level generally below that of the chip guiding members 38. According to a preferred embodiment of the present invention, the substrate engaging members 36 and the chip guiding members 38 may be integrally formed with the first sleeve member 20. In this respect, the first sleeve member 20, the substrate engaging members 36, and the chip guiding members 38 may be molded from a plastic material. However, it is also within the purview of the present invention that the substrate engaging members 36 and the chip guiding members 38 may be separately formed from the first sleeve member 20 and that the substrate engaging members 36 and chip guiding members 38 may be attached to the first sleeve member 20 by any known means (e.g., mechanical fasteners, adhesive, ultrasonic welding, etc.).

As will be discussed in greater detail hereinbelow, the substrate engaging members 36 are generally provided to substantially correctly align the sleeve assembly 12, and thus the electronic chip 14, on the substrate 18. Additionally, the chip guiding members 38 are generally configured to assist in the guidance of the electronic chip 14 into a substantially proper alignment within the sleeve assembly 12. As illustrated in FIG. 1, the electronic chip 14 is attached to the sleeve assembly 12 through the use of an adhesive. However, the electronic chip 14 may be attached to the sleeve assembly 12 through any suitable means, e.g., snaps, press fit, screws, etc.

FIG. 2 also illustrates the substrate 18 as having a socket 16 attached to an upper surface thereof. Although not specifically illustrated in FIG. 2, the socket 16 may be attached to the substrate 18 by any known reasonably suitable means. For example, the socket 16 may be welded, adhered, mechanically fastened, or the like, to the substrate 18. The socket 16 possesses a plurality of socket holes 44 for receiving a plurality of pins 60 extending from a lower surface of the electronic chip 14 (see FIG. 3). The number of socket holes 44 may generally correspond with the number of pins 60. The substrate 18 possesses a plurality of holes 50 for attachment of the substrate onto a section of an electronic system. The substrate 18 also includes a plurality of engaging member holes 52 and a plurality of touch pads 54 (e.g., gold pads), all of which are provided around an outer periphery of the socket 16. The engaging member holes 52 are shaped and positioned to correspond to the shape and position of the substrate engaging members 36 provided on the sleeve assembly 12. In this respect, with reference to FIG. 1, the engaging member holes 52 are dimensioned such that a lower portion of the substrate engaging members 36 may extend through the engaging member holes. Likewise, the touch pads 54 are shaped and positioned to allow for an electrically conductive connection to be made between the conductive members 40 and the touch pads. In further reference to FIG. 1, by virtue of the electrical connection between the conductive members 40 and the touch pads 54, the sleeve assembly 12 is grounded to the substrate 18. In this respect, a faraday cage (or an electromagnetic interference shield) is created around the electronic chip 14 to thereby substantially reducing the electromagnetic (EMI) interference of the chip when the sleeve assembly 12 is fastened to the substrate 18.

In connecting the electronic chip 14 to the socket 16, the activation arm 46 of the socket is placed in a generally raised position prior to insertion of the sleeve assembly 12 and the electronic chip into the socket. After the sleeve assembly 12 and the electronic chip 14 have been relatively correctly positioned, that is, the pins of the electronic chip 14 have been inserted within the socket holes 44 of the socket 16, the activation arm 46 is lowered thereby substantially seating the pins 60 within the socket holes.

Figure 3:
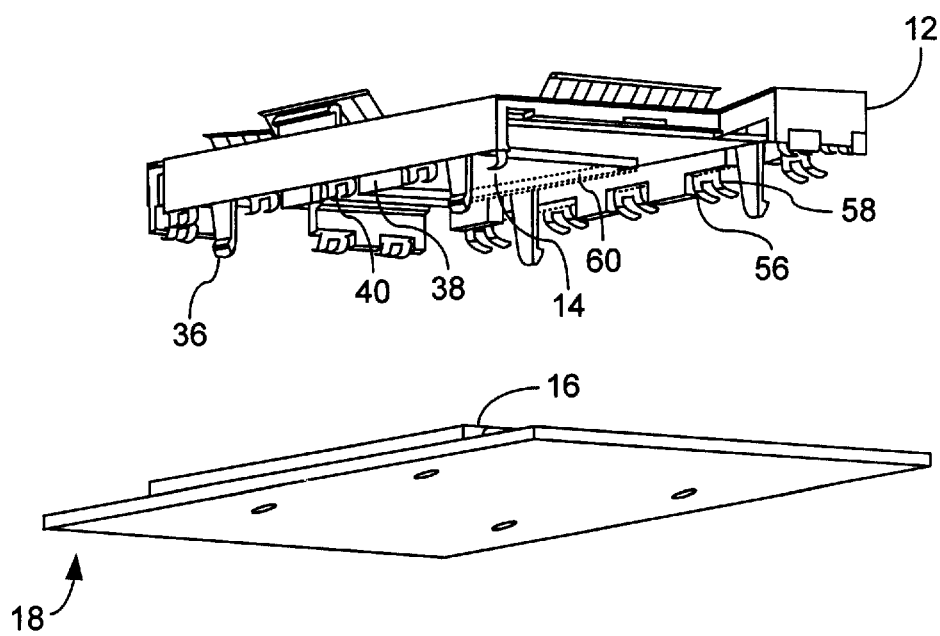
FIG. 3 is an exploded perspective view from a generally bottom side of a sleeve assembly having an electronic chip inserted therein prior to insertion of the sleeve assembly and the electronic chip onto socket of an electronic system.

Referring now to FIG. 3, it can generally be seen that the electronic chip 14 includes a plurality of pins 60 extending from a lower surface of the electronic chip. The substrate engaging members 36 and the chip guiding members 38 extend to a level substantially below the level of the pins 60 to thereby provide a relative amount of protection to the pins during storage of the electronic chips. As can also be seen in FIG. 3, the sleeve assembly 12 is generally illustrated as including four substrate engaging members 36. However, it is within the purview of the present invention that the sleeve assembly 12 may possess any reasonable number of substrate engaging members 36, provided that the number of substrate engaging members is sufficient to adequately guide the sleeve assembly 12 and thus the electronic chip 14 into substantial alignment with the socket 16.

Additionally, although FIG. 3 illustrates the sleeve assembly 12 as possessing a plurality of chip guiding members 38 positioned on each side of the sleeve assembly 12, it is within the purview of the present invention that the sleeve assembly may possess any reasonable number of chip guiding members and that each of the chip guiding members may be positioned on at least one side of the sleeve assembly. Accordingly, chip guiding members 38 may be provided on one, two, three, or four sides of the sleeve assembly 12 and may include any reasonable number of chip guiding members (e.g., there are a sufficient number of chip guiding members to substantially adequately guide an electronic chip 14 into alignment within the sleeve assembly 12).

With further reference to FIG. 3, it can be seen that the substrate engaging members 36 may be positioned in general alignment with the engaging member holes in 52. In this respect, as the sleeve assembly 12 is brought into engagement with the substrate 18, the substrate engaging members 36 engage with the engaging member holes 52. At least the lower portions of the substrate engaging members 36 are configured for insertion within a respective engaging member hole 52. In addition, the location of the substrate engaging members 36 in relation to the electronic chip 14 and the location of the engaging member holes 52 in relation to the socket 16 are such that as the substrate engaging members are inserted into the engaging member holes, the pins 60 of the electronic chip substantially automatically become aligned with the socket holes 44. Thus, the pins 60 may be mated with the socket holes 44 without requiring that the electronic chip 14 itself be maneuvered with. respect to the socket holes 44. In this respect, the sleeve assembly 12 acts to guide the electronic chip 14 into correct alignment with the socket 16 to thereby protect the pins 60 during installation of the chip 14 into the socket 16.

Figure 4:
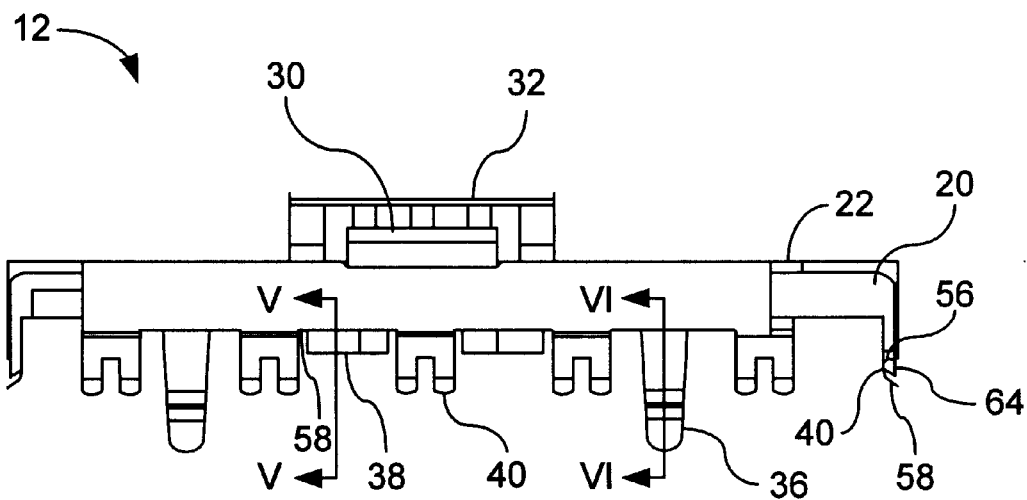
FIG. 4 is a side elevational view of a sleeve assembly in accordance with the principles of the present invention.

Illustrated in FIG. 4 is a side elevational view of a sleeve assembly 12 with a section of the second sleeve 22 removed to show the features of the present invention in greater detail. As seen in FIG. 4, the conductive members 40 include a generally sideways U-shape, in which, a first leg 56 of the conductive member 40 is connected to the second sleeve member 24 and a second leg 58 is substantially free. The first leg 56 is generally substantially horizontal and provides a surface upon which a substantially horizontal section 64 of the first sleeve member 22 may be supported. In this respect, by virtue of the resilience of the conductive members 40, the second sleeve member 22 may be positioned over and fastened to the first sleeve member 20 by aligning the first leg 56 with the substantially horizontal section 64. Thus, according to a preferred embodiment, the first sleeve member 20 and the second sleeve member 22 may be relatively securely fastened together without requiring any additional means for attaching the members together, i.e., the first and second sleeve members may be "snapped" together. It is however, within the purview of the present invention that the first and second sleeve members 20, 22 may be fastened together by any known reasonable means. For example, the first and second sleeve members 20, 22 may be fastened together with mechanical fasteners, adhesive, or the like.

Figure 5:
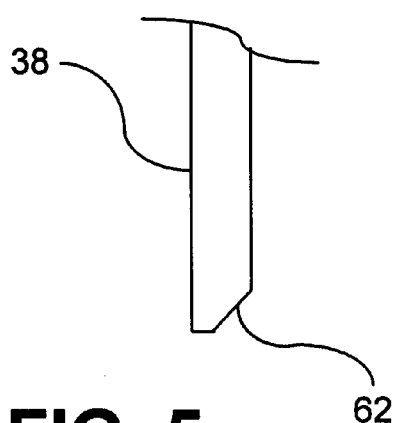
FIG. 5 is an enlarged sectional view of a chip guiding member of the sleeve assembly taken along line V—V in FIG. 4.

Referring now to FIG. 5, there is illustrated an enlarged sectional view of a chip guiding member 38 taken along line V—V in FIG. 4. As seen in FIG. 5, at least one of the chip guiding members 38 includes an angled portion 62 (e.g., a chamfer) for assisting in the insertion of an electronic chip 14 into a sleeve assembly 12. In this respect, each of the angled portions 62 of the chip guiding members 38 are positioned to direct an electronic chip 14 into substantially correct alignment within the sleeve assembly 12. Accordingly, each of the angled portions 62 generally faces towards a center of the sleeve assembly 12.

Figure 6:
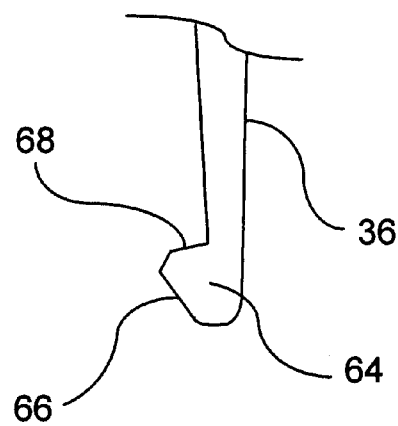
FIG. 6 is an enlarged sectional view of a substrate engaging member of the sleeve assembly taken along line VI—VI in FIG. 4.

Referring to FIG. 6, there is illustrated an enlarged sectional view of a substrate engaging member 36 taken along line VI—VI in FIG. 4. FIG. 6 shows that the substrate engaging member 36 possesses a bulbous portion 64. The bulbous portion 64 being formed by a first and a second slanted portion 66 and 68. The substrate engaging member 36 is generally configured to be relatively resilient such that the substrate engaging member may become deflected as it is inserted within the engaging member hole 52 of the substrate 18. In this respect, according to the principles of the present invention, the first slanted portion 66 of each of the substrate engaging members 36 is configured to enable an outer edge of the engaging member hole to deflect the substrate engaging member 36 as the substrate engaging member is inserted into the engaging member holes 52. Additionally, the second slanted portion 68 is configured to engage an outer edge of the engaging member hole 52 along a bottom surface of the substrate 18 to thus allow the sleeve assembly 12 to be relatively securely attached to the substrate 18. Accordingly, the substrate engaging member 36 may be snapped into engagement with a substrate 18 by merely aligning the substrate engaging members with a respective engaging member hole 52 and applying a force to move the sleeve assembly 12 toward the substrate 18. In this respect, additional means for fastening the sleeve assembly and the substrate 18 are unnecessary. However, it is within the purview of the present invention that the sleeve assembly 12 may be attached to the substrate by any known means, e.g., mechanical fasteners, adhesive, welding, etc. By virtue of the second slanted portion 68, if it becomes necessary to remove the chip 14, the substrate engaging members 36 may be deflected to thus allow the bulbous portion 64 of the sleeve 12 to disengage from the substrate holes 52 of the substrate 18.

According to the principles of the present invention, the sleeve assembly 12 may be attached to the electronic chip 14 at the factory and may remain attached for the life of the chip. The sleeve assembly 12 may thus effectively protect the electronic chip 14 from mechanical damage as well as electrostatic discharge damage during storage of the electronic chip. In addition, the sleeve assembly 12 possesses a plurality of substrate engaging members 36 configured to substantially automatically align an electronic chip 14 with a socket 16 when the substrate engaging members 36 are inserted within engaging member holes 52 of a substrate 18. Thus, the sleeve assembly 12 protects the electronic chip 14 from physical damage during insertion of the chip into a socket 16. Moreover, an electromagnetic interference shield when a sleeve assembly 12 is mated with a substrate 18 such that an electronic chip 14 is connected to a socket 16 to thus substantially protect the chip from electrostatic discharge damage, and to reduce EMI output noise.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A sleeve assembly for housing an electronic chip, said sleeve assembly comprising:
   a first sleeve member;
   a second sleeve member attached to said first sleeve member;
   wherein said first sleeve member comprises at least one substrate engaging member adapted to be inserted into an engaging member hole located on a substrate and at least one chip guiding member adapted to substantially correctly align an electronic chip when said electronic chip is inserted into said sleeve assembly, wherein each of said at least one chip guiding member includes an angled portion for assisting in the placement of the electronic chip within said sleeve assembly, and wherein said at least one substrate engaging member and said at least one chip guiding member extend from a lower surface of said sleeve assembly.

2. The sleeve assembly according to claim 1, wherein said first sleeve member, each of said at least one substrate engaging member, and each of said at least one chip guiding member are integrally formed of a plastic material.

3. The sleeve assembly according to claim 1, further comprising a plurality of first upwardly extending protrusions extending from said first sleeve member configured as handles and a plurality of second upwardly extending protrusions extending from said second sleeve member configured to protect said electronic chip from electrostatic discharger.

4. The sleeve assembly according to claim 1, wherein said second sleeve member comprises a plurality of conductive members extending from a lower surface of said second member.

5. The sleeve assembly according to claim 4, wherein said second sleeve member and said conductive members are integrally formed of metal.

6. The sleeve assembly according to claim 1, wherein each of said at least one substrate engaging member is positioned such that each of said at least one substrate engaging member is configured to mate with a respective mounting hole provided on said substrate.

7. The sleeve assembly according to claims 6, wherein each of said at least one substrate engaging member comprises first and second slanted portions, wherein said first slanted portion is operable to assist in insertion of each of said at least one guiding member into each said respective mounting hole, and wherein said second slanted portion is operable to substantially maintain each of said at least one substrate engaging member in connection with each said respective mounting hole, while allowing for each of the at least one substrate mounting member to be releasable from each said respective mounting hole.

8. A system for protecting and guiding an electronic chip into engagement with a socket, said system comprising:
   a sleeve assembly enclosing an electronic chip, said sleeve assembly comprising a first sleeve member and a second sleeve member, wherein said first sleeve member supports said electronic chip and wherein said second sleeve member is configured to substantially protect said electronic chip from electrostatic discharge;
   a substrate supporting said socket, wherein said socket receives said electronic chip; and
   wherein said sleeve assembly comprises at least one substrate engaging member and at least one chip guiding member.

9. The system for protecting and guiding an electronic chip according to claim 8, wherein said at least one chip guiding member includes an angled portion for assisting in the placement of the electronic chip within said sleeve assembly.

10. The system for protecting and guiding an electronic chip according to claim 8, wherein said substrate comprises at least one engaging member hole, wherein each of said at least one substrate engaging member is inserted within a respective ones of said at least one engaging member hole.

11. The system for protecting and guiding an electronic chip according to claim 10, wherein said at least one substrate engaging member and said at least one engaging member hole are positioned in relation to said electronic chip and said socket to substantially align said electronic chip with said socket during insertion of each of said at least one substrate engaging member into each of said engaging member hole.

12. The sleeve assembly according to claim 9, wherein each of said at least one substrate engaging member comprises first and second slanted portions, wherein said first slanted portion is operable to assist in insertion of each of said at least one guiding member into each said respective mounting hole, and wherein said second slanted portion is operable to substantially maintain each of said at least one substrate engaging member in connection with each said respective mounting hole, while allowing for each of the at least one substrate mounting member to be releaseable from each said respective mounting hole.

13. A system for protecting and guiding an electronic chip into engagement with a socket, said system comprising:

a sleeve assembly enclosing an electronic chip, said sleeve assembly comprising a first sleeve member and a second sleeve member, wherein said first sleeve member supports said electronic chip and wherein said second sleeve member is configured to substantially protect said electronic chip from electrostatic discharge;

a substrate supporting said socket, wherein said socket receives said electronic chip; and wherein said second sleeve member includes a plurality of conductive members extending from a lower surface of said second sleeve member, wherein said conductive members are operable to engage with a plurality of touch pads provided on said substrate to thereby effectuate an electromagnetic interference shield for said electronic chip.

14. A method for protecting and guiding an electronic chip on to a socket positioned on a substrate of an electronic system, said method comprising the steps of:

inserting an electronic chip into a sleeve assembly having a first sleeve member and a second sleeve member, said sleeve assembly comprising a plurality of substrate engaging members;

guiding said plurality of substrate engaging members of said sleeve assembly into respective ones of a plurality of mounting holes provided on said substrate; and wherein said step of guiding said plurality of substrate engaging members includes the step of inserting a plurality of pins from said electronic chip into a plurality of holes provided on said socket.

15. The method according to claim 14, further comprising the step of:

forming a substantially complete electromagnetic shield around said electronic chip.

16. The method according to claim 15, wherein said electromagnetic shield formation step comprises the step of electrically contacting a plurality of contacts positioned on said sleeve assembly with a plurality of contact pads formed on said substrate.

* * * * *